United States Patent
Morikawa

[11] Patent Number: 6,118,328
[45] Date of Patent: Sep. 12, 2000

[54] SEMICONDUCTOR INTEGRATED CIRCUIT HAVING VIRTUAL POWER SUPPLY LINE AND POWER CONTROL TRANSISTOR

[75] Inventor: Koichi Morikawa, Tokyo, Japan

[73] Assignee: Oki Electric Industry Co., Ltd., Tokyo, Japan

[21] Appl. No.: 09/144,433

[22] Filed: Sep. 1, 1998

[30] Foreign Application Priority Data

Jun. 17, 1998 [JP] Japan ................... 10-170070

[51] Int. Cl.[7] ............................................... H03K 3/01
[52] U.S. Cl. ............................................................. 327/534
[58] Field of Search ............................. 327/534, 535, 327/537; 36/34; 365/226

[56] References Cited

U.S. PATENT DOCUMENTS

| | | | |
|---|---|---|---|
| 5,140,623 | 8/1992 | Imai t al. .................................... | 377/60 |
| 5,644,266 | 7/1997 | Chen et al. ............................... | 327/534 |
| 5,821,769 | 10/1998 | Douseki .................................... | 326/34 |
| 5,917,365 | 6/1999 | Houston .................................... | 327/534 |

OTHER PUBLICATIONS

Shin'ichiro Mutoh et al., "1–V Power Supply High–Speed Digital Circuit Technology with Multithreshold–Voltage CMOS", IEEE Journal of Solid–State Circuits, vol. 30, No. 8, Aug. 1995, pp. 846–854.

Primary Examiner—Terry D. Cunningham
Assistant Examiner—Guan Tra
Attorney, Agent, or Firm—Jones Volentine, LLP

[57] ABSTRACT

The invention intends to provide a semiconductor integrated circuit including MOS transistors, which is able to operate at a high-speed with a low power supply voltage in the active mode, and to reduce the power consumption resulting from the leakage current in the standby mode.

In view of the foregoing object, the semiconductor integrated circuit of the invention is comprised of a first power supply line to which a first power supply potential is supplied, a virtual power supply line, a logic circuit connected to the virtual power supply line, a power control transistor provided between the first power supply line and the virtual power supply line, having a control electrode to which a first control signal is inputted, a second power supply line to which a second power supply potential is supplied, and a substrate potential control circuit connected to a substrate on which the power control transistor is formed, the first power supply line, and the second power supply line.

20 Claims, 6 Drawing Sheets

6,118,328

SEMICONDUCTOR INTEGRATED CIRCUIT HAVING VIRTUAL POWER SUPPLY LINE AND POWER CONTROL TRANSISTOR

BACKGROUND OF THE INVENTION

Accompanied with the recent trend for a higher integration or higher performance of LSIs, the reduction of the power consumption has been recognized as an important problem. Specially, in the CMOS LSI, the power consumption is proportional to the square of the power supply voltage, and accordingly, decreasing the power supply voltage can be the most effective method for reducing the power consumption of the LSI. However, decreasing the power supply voltage leads to decreasing the operation speed of the MOS transistor. In order to avoid this, the threshold voltage in the active mode is needed to be reduced; however, the reduction of the threshold voltage leads to the increase of leakage current of the MOS transistor in the standby mode. As an LSI to solve such a problem, an MTCMOS (Multithreshold-Voltage CMOS) has been proposed. The MTCMOS is presented, for example, in the study: "1-V Power Supply High-Speed Digital Circuit Technology with Multithreshold-Voltage CMOS (IEEE JOURNAL OF SOLID STATE CIRCUIT. VOL. 30. NO. 8, AUGUST 1995)".

In general, this type of MTCMOS is connected between a virtual power supply line and a virtual ground line. It is comprised of logic circuits of MOS transistors having a low threshold voltage, and standby power control MOS transistors having a high threshold voltage, which are connected between the power supply line and the virtual power supply line and between the ground line and the virtual ground line, in order to reduce the leakage current of the MOS transistors in the standby mode.

However, since the threshold voltage of the standby power control MOS transistors used for reducing the leakage current in the standby mode is set sufficiently high, the virtual power supply line VVDD or the virtual ground line VGRD is not supplied with a sufficient current in the active mode. In consequence, the MTCMOS is not able to achieve a high-speed logic operation, which is disadvantageous.

SUMMARY OF THE INVENTION

The present invention has been made in view of the foregoing problems, and an object of the present invention is to provide a semiconductor integrated circuit including MOS transistors, which is able to operate at a high-speed with a low power supply voltage in the active mode, and to reduce the power consumption resulting from the leakage current in the standby mode.

In order to accomplish the foregoing object, the semiconductor integrated circuit of the invention is comprised of a first power supply line to which a first power supply potential is supplied, a virtual power supply line, a logic circuit connected to the virtual power supply line, a power control transistor provided between the first power supply line and the virtual power supply line, having a control electrode to which a first control signal is inputted, a second power supply line to which a second power supply potential is supplied, and a substrate potential control circuit connected to a substrate on which the power control transistor is formed, the first power supply line, and the second power supply line.

BRIEF DESCRIPTION OF THE DRAWINGS

While the specification concludes with claims particularly pointing out and distinctly claiming the subject matter which is regarded as the invention, it is believed that the invention, the objects, features of the invention and further objects, features and advantages thereof will be better understood from the following description taken in connection with the accompanying drawings in which:

DESCRIPTION OF THE PREFERRED EMBODIMENTS

First Embodiment

Figure 1:
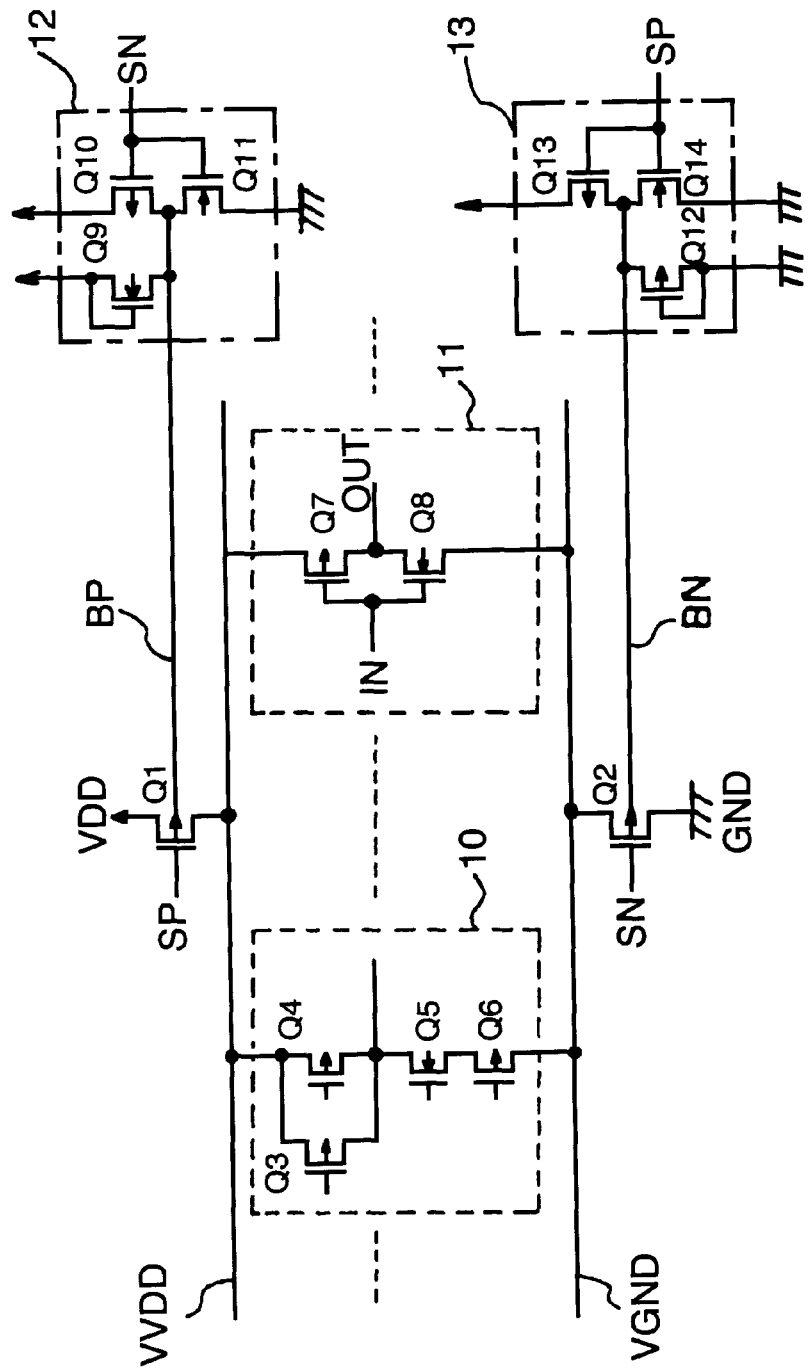
FIG. 1 is a circuit diagram to illustrate a first embodiment of the present invention.
Figure 2:
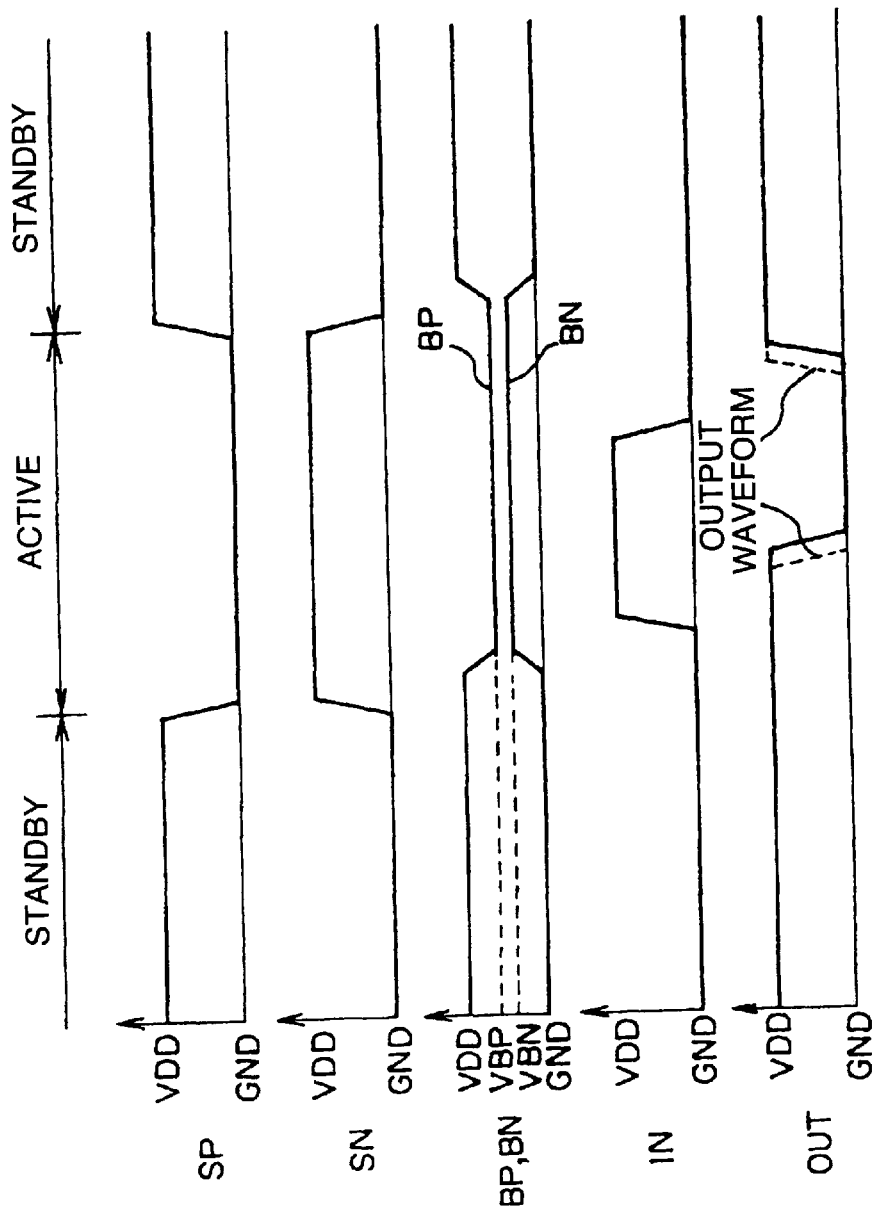
FIG. 2 is a waveform chart to illustrate the operation of the first embodiment of the invention.

FIG. 1 is a circuit diagram to illustrate the first embodiment of the invention, and FIG. 2 is a waveform chart to explain the operation of the first embodiment of the invention.

An MTCMOS as shown in FIG. 1 is comprised of logic circuits 10, 11 connected between a virtual power supply line VVDD and a virtual ground line VGND, a standby power control PMOS transistor Q1 connected between a power supply line VDD and the virtual power supply line VVDD, having a higher threshold voltage, which is controlled by a standby power control signal SP, and a standby power control NMOS transistor Q2 connected between the virtual ground line VGND and a ground line GND, having a higher threshold voltage, which is controlled by a standby power control signal SN being the inverted signal of the standby power control signal SP. Further, the MTCMOS is provided with a first substrate potential control circuit 12 connected to a first conductive substrate BP on which the standby power control PMOS transistor Q1 is formed, the power supply line VDD, and the ground line GND, and a second substrate potential control circuit 13 connected to a second conductive substrate BN on which the standby power control NMOS transistor Q2 is formed, the power supply line VDD, and the ground line GND.

The logic circuit 10 forms a two-input NAND circuit configured with PMOS transistors Q3, Q4, and NMOS transistors Q5, Q6. The logic circuit 11 forms an inverter circuit configured with a PMOS transistor Q7, and an NMOS transistor Q8. Further, the MOS transistors Q3 through Q8 of the logic circuits 10, 11 have a lower threshold voltage than the standby power control MOS transistors Q1, Q2. In consequence, the logic circuits 10, 11 can operate at a low power supply voltage of about 1 Volt in the active mode.

The first substrate potential control circuit 12 is configured with an NMOS transistor Q9 having the source electrode connected to the first conductive substrate BP and the gate and drain electrodes commonly connected to the power supply line VDD, a PMOS transistor Q10 having the gate electrode to which the standby power control signal SN is inputted, the source electrode connected to the power supply line VDD, and the drain electrode connected to the first conductive substrate BP, and an NMOS transistor Q1 having the gate electrode to which the standby power control signal SN is inputted, the source electrode connected to the ground line GND, and the drain electrode connected to the first conductive substrate BP. The second substrate potential control circuit 13 is configured with a PMOS transistor Q12 having the source electrode connected to the second conductive substrate BN and the gate and drain electrodes commonly connected to the ground line GND, a PMOS transistor Q13 having the gate electrode to which the standby power control signal SP is inputted, the source electrode connected to the power supply line VDD, and the drain electrode connected to the second conductive substrate BN, and an NMOS transistor Q14 having the gate electrode to which the standby power control signal SP is inputted, the source electrode connected to the ground line GND, and the drain electrode connected to the second conductive substrate BN. The NMOS transistors Q9 and Q12 used in these control circuits have a lower threshold voltage than the MOS transistors Q10, Q11, Q13, and Q14.

The operation of the first embodiment will be described with reference to FIG. 1 and FIG. 2.

First, in the standby mode, the standby power control signal SP becomes the high level and the standby power control signal SN being the inverted signal thereof becomes the low level, and the standby power control PMOS transistor Q1 and NMOS transistor Q2 are both brought into OFF. Accordingly, the logic circuits 10, 11 are not supplied with a potential of the VDD level and a potential of the GND level. At this moment, the PMOS transistor Q10 to which the standby power control signal SN is inputted is switched into ON, and the NMOS transistor Q11 is switched into OFF. And, the PMOS transistor Q13 to which the standby power control signal SP is inputted is switched into OFF, and the NMOS transistor Q14 is switched into ON. Thereby, the first conductive substrate BP on which the standby power control PMOS transistor Q1 is formed is supplied with a potential of the VDD level, and the second conductive substrate BN on which the standby power control NMOS transistor Q2 is formed is supplied with a potential of the GND level. Both the substrate potentials of the standby power control PMOS transistor Q1 and the standby power control NMOS transistor Q2 are zero volt at this moment.

Next, in the active mode, the standby power control signal SP becomes the low level and the standby power control signal SN being the inverted signal thereof becomes the high level, and the standby power control PMOS transistor Q1 and NMOS transistor Q2 are both brought into ON. Since the logic circuits 10, 11 are supplied with a potential of the VDD level and a potential of the GND level, the logic circuits 10, 11 are operational. At this moment, the PMOS transistor Q10 to which the standby power control signal SN is inputted is switched into OFF, and the NMOS transistor Q11 is switched into ON. And, the PMOS transistor Q13 to which the standby power control signal SP is inputted is switched into ON, and the NMOS transistor Q14 is switched into OFF. Thereby, the first conductive substrate BP on which the standby power control PMOS transistor Q1 is formed is supplied with the potential VBP which is determined by the ratio between the ON-resistances of the NMOS transistor Q9 and the NMOS transistor Q11, and the second conductive substrate BN on which the standby power control NMOS transistor Q2 is formed is supplied with the potential VBN which is determined by the ratio between the ON-resistances of the PMOS transistor Q12 and the PMOS transistor Q13. The substrate potential of the standby power control PMOS transistor Q1 is –(VDD –VBP) [V], and the substrate potential of the standby power control NMOS transistor Q2 is VBN [V] at this moment. Therefore, the threshold voltages of the standby power control PMOS transistor Q1 and the standby power control NMOS transistor Q2 in the active mode become lower than those in the standby mode, owing to the bias effect of the substrate.

Therefore, in the standby mode, the standby power control PMOS transistor Q1 and the standby power control NMOS transistor Q2 which have a higher threshold voltage reduce leakage currents resulting from the subthreshold currents of the MOS transistors. And, in the active mode, the current drive capability of the standby power control PMOS transistor Q1 and the standby power control NMOS transistor Q2 can be improved; and therefore, the logic circuits 10, 11 are able to operate at a high speed. This can be confirmed from the output waveform OUT of the inverter circuit constituting the logic circuit 11 in FIG. 2. In FIG. 2, the output waveform of the inverter circuit in the first embodiment of the invention is indicated by the dotted line, and the output waveform of the conventional inverter circuit is illustrated by the solid line. This difference confirms that the inverter circuit in the first embodiment inverts faster than the conventional inverter.

And, forward biases are applied between the source electrode of the standby power control PMOS transistor Q1 and the first conductive substrate BP, and between the second conductive substrate BN and the source electrode of the standby power control NMOS transistor Q2, both of which form PN junctions. On the other hand, if the bias voltage is lower than the junction voltage (about 0.6~0.9 [V]) being the physical constant, the current flowing through the PN junctions are extremely low. Accordingly, to set the forward biases applied to the PN junction between the source electrode of the standby power control PMOS transistor Q1 and the first conductive substrate BP, and the PN junction between the second conductive substrate BN and the source electrode of the standby power control NMOS transistor Q2 so as to become less than the junction voltage will significantly reduce the leakage current flowing into the substrates through these PN junctions as low as negligible. Further, with regard to the leakage currents through the NMOS transistor Q9 and the PMOS transistor Q12 in the standby mode, both the NMOS transistor Q11 and the PMOS transistor Q13 become OFF in the standby mode, which intercepts the concerned leakage currents.

Second Embodiment

Figure 3:
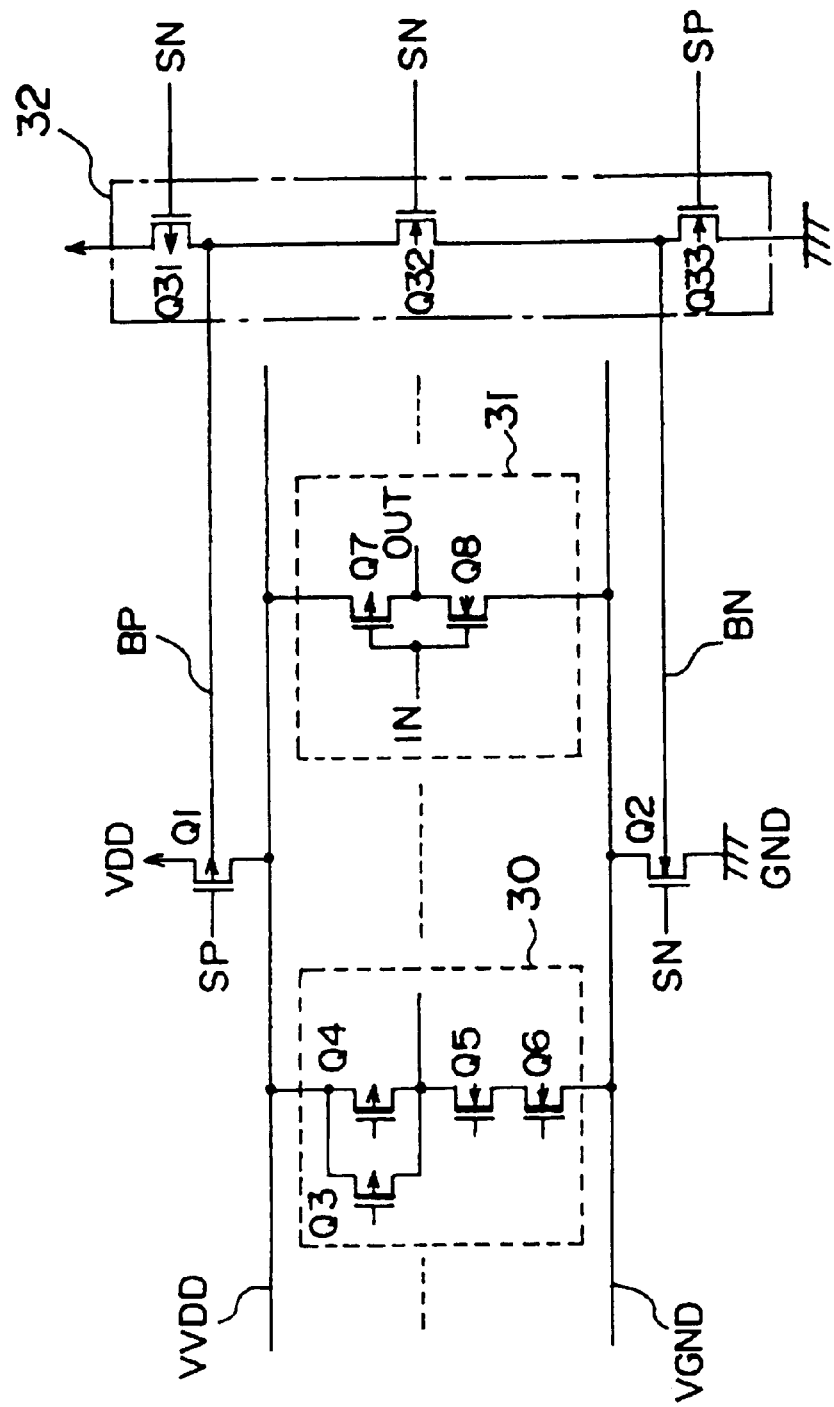
FIG. 3 is a circuit diagram to illustrate a second embodiment of the invention.
Figure 4:
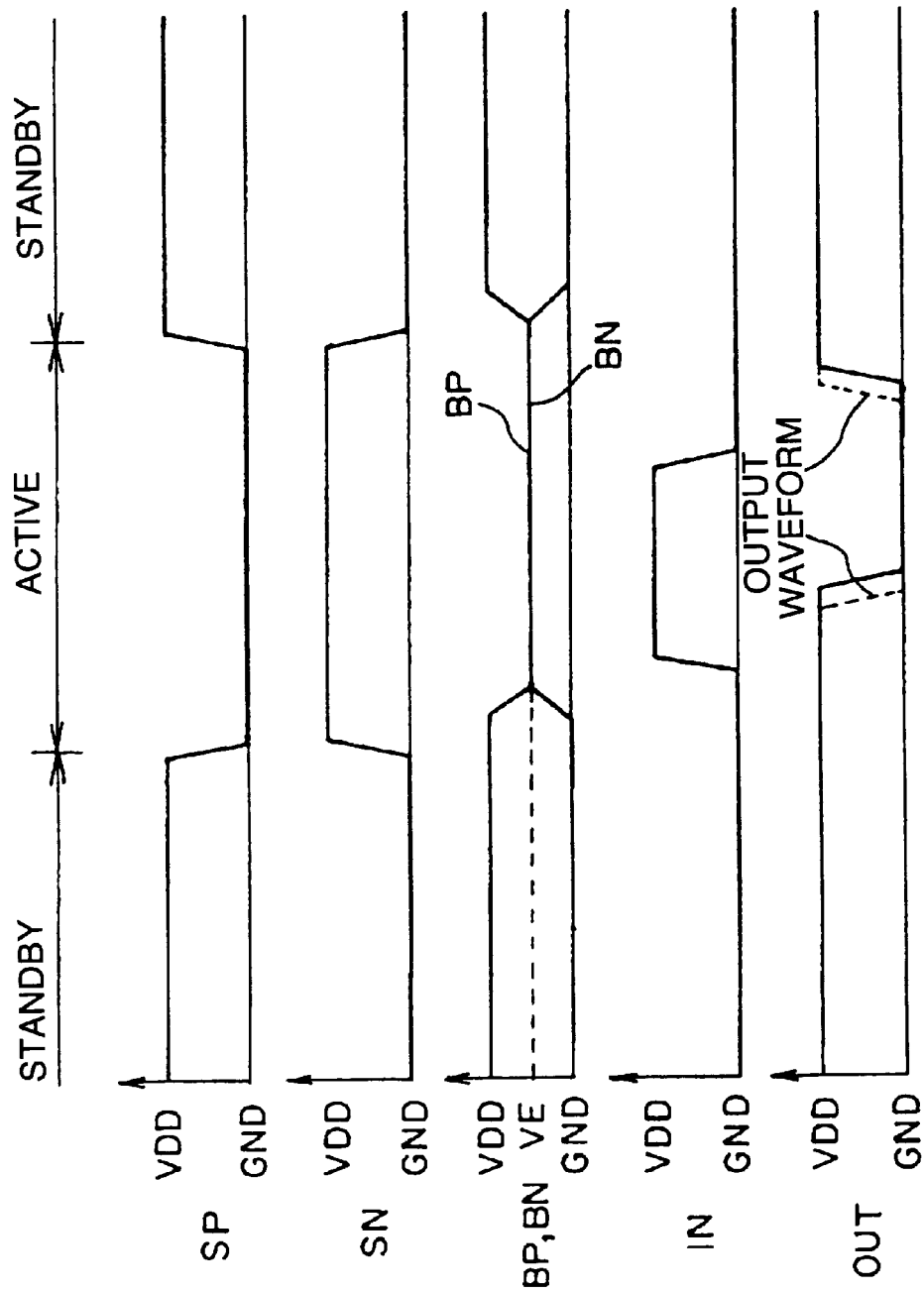
FIG. 4 is a waveform chart to illustrate the operation of the second embodiment of the invention.

FIG. 3 is a circuit diagram to illustrate the second embodiment of the invention, and FIG. 4 is a waveform chart to explain the operation of the second embodiment of the invention. The same components as in FIG. 1 are given the same symbols, and the repetitive description will be omitted. The second embodiment is discriminated from the first embodiment in the concrete construction of the substrate potential control circuit and the operation thereof. As shown in FIG. 3, the substrate potential control circuit 32 is connected to the power supply line VDD and the ground line GND, and the first conductive substrate BP on which the standby power control PMOS transistor Q1 is formed and the second conductive substrate BN on which the standby power control NMOS transistor Q2 is formed.

Further, the substrate potential control circuit 32 is comprised of: a PMOS transistor Q31 having the gate electrode to which the standby power control signal SN is inputted, the source electrode connected to the power supply line VDD, and the drain electrode connected to the first conductive substrate BP; an NMOS transistor Q32 having the gate electrode to which the standby power control signal SN is inputted, the source electrode connected to the second conductive substrate BN, and the drain electrode connected to the first conductive substrate BP; and an NMOS transistor Q33 having the gate electrode to which the standby power control signal SP is inputted, the source electrode connected to the ground line GND, and the drain electrode connected to the second conductive substrate BN. The MOS transistors Q31~Q33 constituting the substrate potential control circuit 32 possess the same threshold voltage.

The operation of the second embodiment will be described with reference to FIG. 3 and FIG. 4.

First, in the standby mode, the standby power control signal SP becomes the high level and the standby power control signal SN being the inverted signal thereof becomes the low level. Accordingly, the PMOS transistor Q31 to which the standby power control signal SN is inputted becomes ON, and the NMOS transistor Q32 becomes OFF. And, the NMOS transistor Q33 to which the standby power control signal SP is inputted becomes ON. Thereby, the first conductive substrate BP on which the standby power control PMOS transistor Q1 is formed is supplied with a potential of the VDD level, and the second conductive substrate BN on which the standby power control NMOS transistor Q2 is formed is supplied with a potential of the GND level. Both the substrate potentials of the standby power control PMOS transistor Q1 and the standby power control NMOS transistor Q2 are zero volt at this moment.

Next, in the active mode, the standby power control signal SP becomes the low level and the standby power control signal SN being the inverted signal thereof becomes the high level. Accordingly, the PMOS transistor Q31 and the NMOS transistor Q33 are both brought into OFF, and the NMOS transistor Q32 is brought into ON. Thereby, the first conductive substrate BP on which the standby power control PMOS transistor Q1 is formed, and the second conductive substrate BN on which the standby power control NMOS transistor Q2 is formed are supplied with an equalized potential VE which corresponds to about VDD/2. The substrate potential of the standby power control PMOS transistor Q1 is –(VDD –VE) [V], and the substrate potential of the standby power control NMOS transistor Q2 is VE [V] at this moment. Therefore, the threshold voltages of the standby power control PMOS transistor Q1 and the standby power control NMOS transistor Q2 in the active mode become lower than those in the standby mode, owing to the bias effect of the substrate.

Therefore, in the standby mode, the standby power control PMOS transistor Q1 and the standby power control NMOS transistor Q2 which have a higher threshold voltage reduce leakage currents resulting from the subthreshold currents of the MOS transistors. And, in the active mode, the current drive capability of the standby power control PMOS transistor Q1 and the standby power control NMOS transistor Q2 can be improved; and therefore, the logic circuits 10, 11 are able to operate at a high speed. This can be confirmed from the output waveform OUT of the inverter circuit constituting the logic circuit 11 in FIG. 4. In FIG. 4, the output waveform of the inverter circuit in the second embodiment of the invention is indicated by the dotted line, which shows that it inverts faster than the conventional inverter circuit of which output waveform is illustrated by the solid line.

And, as to the equalized potential VE, to set the forward biases applied to the PN junction between the source electrode of the standby power control PMOS transistor Q1 and the first conductive substrate BP, and the PN junction between the second conductive substrate BN and the source electrode of the standby power control NMOS transistor Q2 so as to become less than the junction voltage which has been described in the first embodiment will significantly reduce the leakage current flowing into the substrates through these PN junctions as low as negligible.

Figure 5:
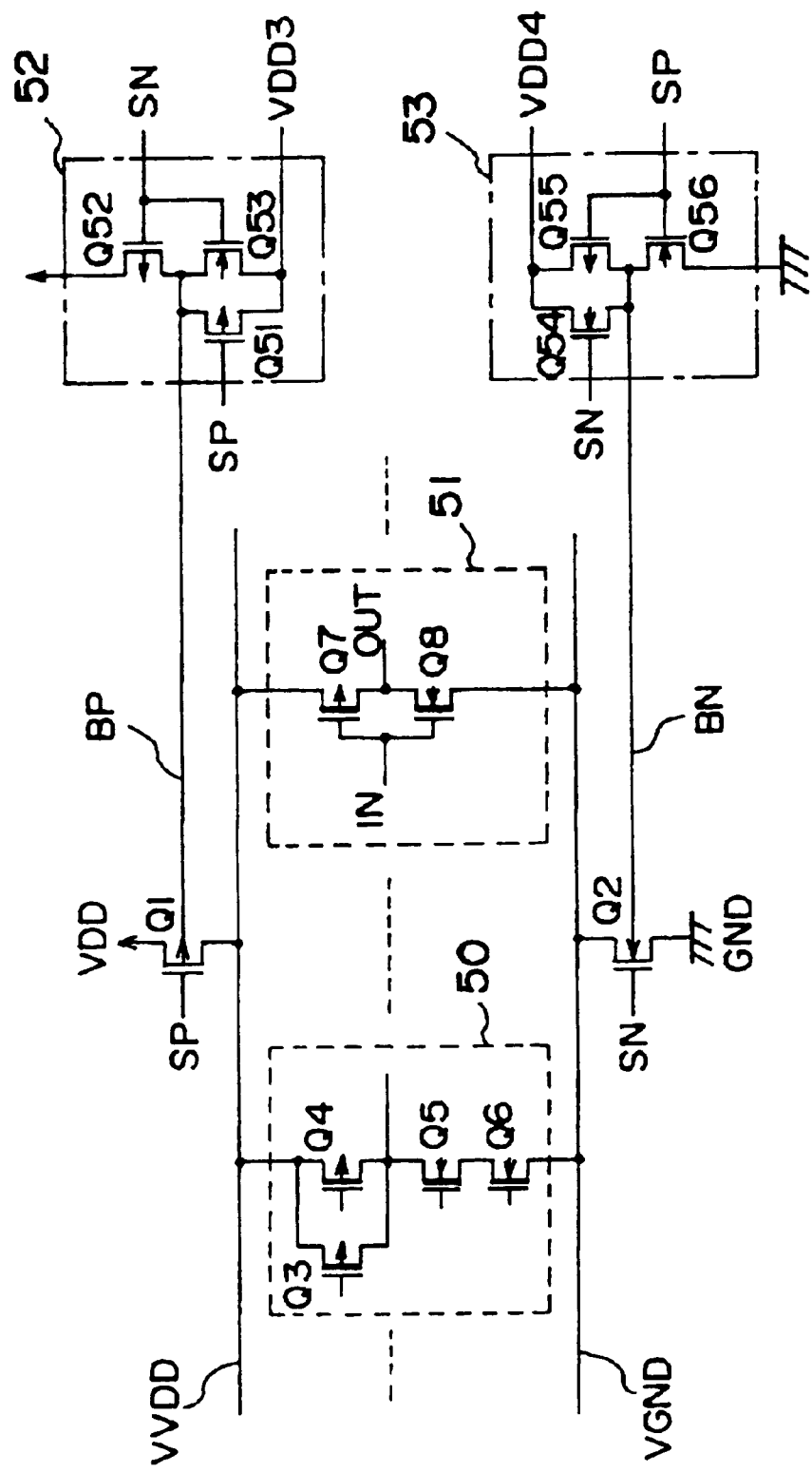
FIG. 5 is a circuit diagram to illustrate a third embodiment of the invention.
Figure 6:
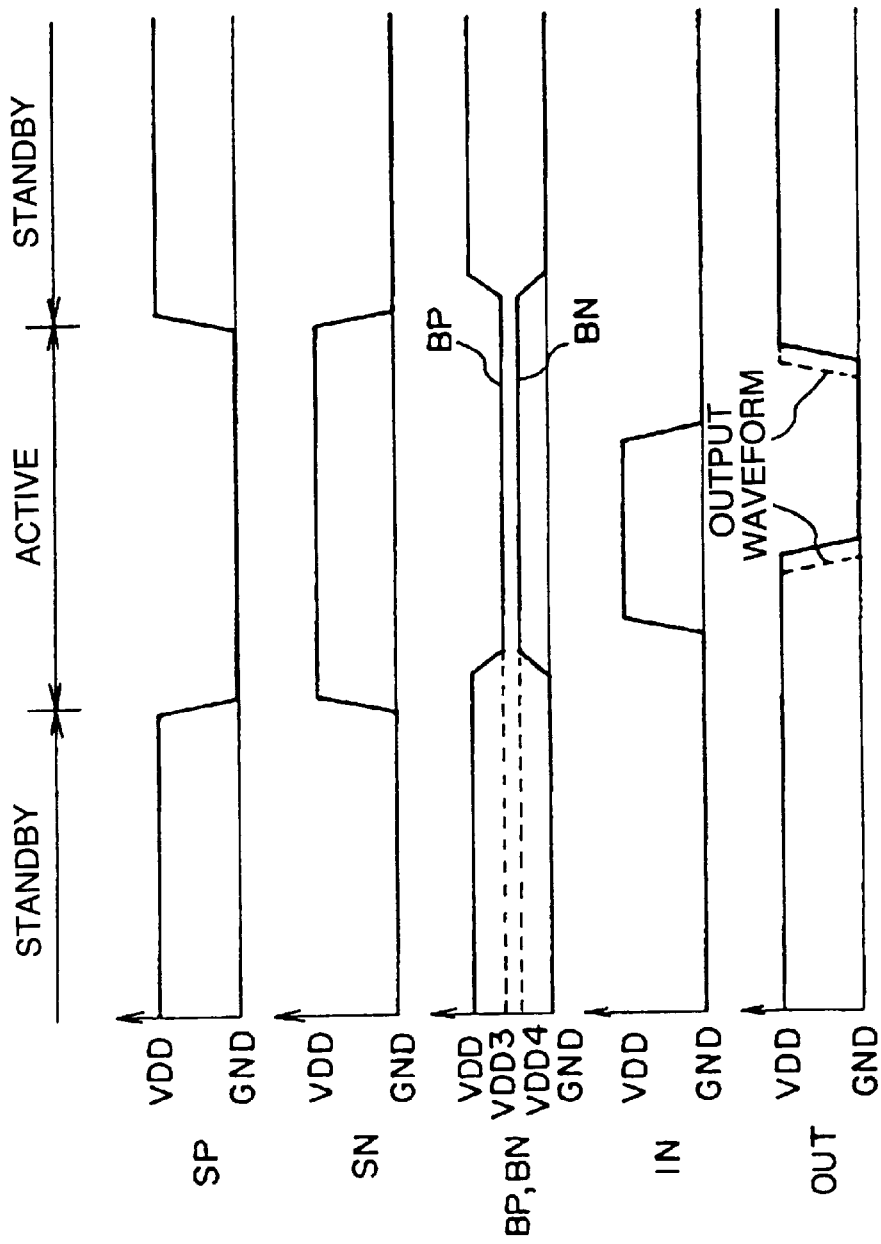
FIG. 6 is a waveform chart to illustrate the operation of the third embodiment of the invention.

The second embodiment effects a high-speed logic operation, in the same manner as in the first embodiment. In addition, the first embodiment requires six MOS transistors to constitute the substrate potential control circuit, however, the second embodiment needs only three MOS transistors. This reduction leads to the reduction of circuit area. Further, since this embodiment does not have the ratio circuit as the first and second substrate potential control circuits 12, 13 in the first embodiment, a DC path is not formed, and a DC current is not consumed, which contributes to reduce the power consumption. Third Embodiment FIG. 5 is a circuit diagram to illustrate the third embodiment of the invention, and FIG. 6 is a waveform chart to explain the operation of the third embodiment of the invention. The same components as in FIG. 1 and FIG. 3 are given the same symbols, and the repetitive description will be omitted. The third embodiment is discriminated from the first and second embodiments in the concrete construction of the first and second substrate potential control circuits and the operation thereof. As shown in FIG. 5, the first substrate potential control circuit 52 is connected to the first conductive substrate BP on which the standby power control PMOS transistor Q1 is formed, the power supply line VDD, and the third power supply line VDD3. And, the second substrate potential control circuit 53 is connected to the second conductive substrate BN on which the standby power control NMOS transistor Q2 is formed, the ground line GND, and the fourth power supply line VDD4.

The first substrate potential control circuit 52 is configured with a PMOS transistor Q51 having the gate to which the standby power control signal SP is inputted, the source electrode connected to the first conductive substrate BP, and the drain electrode connected to the third power supply line VDD3, a PMOS transistor Q52 having the gate electrode to which the standby power control signal SN is inputted, the source electrode connected to the power supply line VDD, and the drain electrode connected to the first conductive substrate BP, and an NMOS transistor Q53 having the gate electrode to which the standby power control signal SN is inputted, the source electrode connected to the third power supply line VDD3, and the drain electrode connected to the first conductive substrate BP. The second substrate potential control circuit 53 is configured with an NMOS transistor Q54 having the gate electrode to which the standby power control signal SN is inputted, the source electrode connected to the second conductive substrate BN, and the drain electrode connected to the fourth power supply line VDD4, a PMOS transistor Q55 having the gate electrode to which the standby power control signal SP is inputted, the source electrode connected to the fourth power supply line VDD4, and the drain electrode connected to the second conductive substrate BN, and an NMOS transistor Q56 having the gate electrode to which the standby power control signal SP is inputted, the source electrode connected to the ground line GND, and the drain electrode connected to the second conductive substrate BN. The NMOS transistors Q51~Q56 constituting the first and second substrate potential control circuits 52, 53 have one and the same threshold voltage.

Next, the operation of the third embodiment will be described with reference to FIG. 5 and FIG. 6.

First, in the standby mode, the standby power control signal SP becomes the high level and the standby power control signal SN being the inverted signal thereof becomes the low level. Accordingly, the PMOS transistor Q52 to which the standby power control signal SN is inputted is brought into ON, and the NMOS transistors Q53, Q54 are both brought into OFF. And, the PMOS transistors Q51, Q55 to which the standby power control signal SP is inputted are brought into OFF, and the NMOS transistor Q56 is brought into ON. Thereby, the first conductive substrate BP on which the standby power control PMOS transistor Q1 is formed is supplied with a potential of the VDD level, and the second conductive substrate BN on which the standby power control NMOS transistor Q2 is formed is supplied with a potential of the GND level. Both the substrate potentials of the standby power control PMOS transistor Q1 and the standby power control NMOS transistor Q2 are zero volt at this moment.

Next, in the active mode, the standby power control signal SP becomes the low level and the standby power control signal SN being the inverted signal thereof becomes the high level. Accordingly, the PMOS transistors Q51, Q55 to which the standby power control signal SP is inputted are brought into ON, and the NMOS transistor Q56 is brought into OFF. And, the PMOS transistor Q52 to which the standby power control signal SN is inputted is brought into OFF, and the NMOS transistors Q53, Q54 are brought into ON. Thereby, the first conductive substrate BP on which the standby power control PMOS transistor Q1 is formed is supplied with a potential of the VDD3 level, and the second conductive substrate BN on which the standby power control NMOS transistor Q2 is formed is supplied with a potential of the VDD4 level. The substrate potential of the standby power control PMOS transistor Q1 is −(VDD −VDD3) [V], and the substrate potential of the standby power control NMOS transistor Q2 is VDD4 [V] at this moment. Therefore, the threshold voltages of the standby power control PMOS transistor Q1 and the standby power control NMOS transistor Q2 in the active mode become lower than those in the standby mode, owing to the bias effect of the substrate.

Therefore, in the standby mode, the standby power control PMOS transistor Q1 and the standby power control NMOS transistor Q2 which have a higher threshold voltage reduce leakage currents resulting from the subthreshold currents of the MOS transistors. And, in the active mode, the current drive capability of the standby power control PMOS transistor Q1 and the standby power control NMOS transistor Q2 can be improved; and therefore, the logic circuits 10, 11 are able to operate at a high speed. This can be confirmed from the output waveform OUT of the inverter circuit constituting the logic circuit 11 in FIG. 6. In FIG. 6, the output waveform of the inverter circuit in the third embodiment of the invention is indicated by the dotted line, which shows that it inverts faster than the conventional inverter circuit of which output waveform is illustrated by the solid line.

And, as to the potential of the VDD3 level and the potential of the VDD4 level, to set the forward biases applied to the PN junction between the source electrode of the standby power control PMOS transistor Q1 and the first conductive substrate BP, and the PN junction between the second conductive substrate BN and the source electrode of the standby power control NMOS transistor Q2 so as to become less than the junction voltage which has been described in the first embodiment will significantly reduce the leakage current flowing into the substrates through these PN junctions as low as negligible.

The third embodiment achieves a high-speed logic operation, in the same manner as in the first embodiment. In addition, the first embodiment will invite the variations of the potentials supplied to the first and second conductive substrates depending on the production dispersion of the MOS transistors; however the third embodiment is immune to the production dispersion of the MOS transistors, and the variations of the potentials supplied to these substrates can be reduced to minimum. This is because the first and second conductive substrates are supplied with the potentials from the third power supply line VDD3 and the fourth power supply line VDD4 which are connected to the external power supply. This also effects to reduce the dispersion of delay time in the logic circuits 10, 11.

As it has been described in detail, the invention is provided with the substrate potential control circuit controlled by the standby power control signal; and thereby, the invention achieves in the standby mode to reduce the leakage current resulting from the subthreshold currents of the MOS transistors, and it achieves in the active mode to enhance the drive capability of the standby power control MOS transistors and to thereby operate the logic circuits at a high speed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit comprising:
   a first power supply line to which a first power supply potential is supplied;
   a virtual power supply line;
   a logic circuit connected to the virtual power supply line, the logic circuit including a plurality of transistors, each of the transistors having a predetermined threshold voltage;
   a power control transistor provided between the first power supply line and the virtual power supply line, having control electrode to which a first control signal is inputted the power control transistor having a threshold voltage which is higher than the threshold voltage of said transistors of said logic circuit when the power control transistor is in a non-active state;
   a second power supply line to which a second power supply potential is supplied; and
   a substrate potential control circuit connected to a substrate on which the power control transistor is formed, the first power supply line, and the second power supply line, the substrate potential control circuit adjusting a substrate potential such that the threshold voltage of the power control transistor in an active state of the power control transistor is lower than the threshold voltage of the power control transistor in the non-active state of the power control transistor.

2. A semiconductor integrated circuit as claimed in claim 1, wherein the substrate potential control circuit comprises:
   a first transistor having a control electrode and a first electrode commonly connected to the first power supply line, and a second electrode connected to the substrate;
   a second transistor having a control electrode to which a second control signal is inputted, a first electrode connected to the first power supply line, and a second electrode connected to the substrate; and
   a third transistor having a control electrode to which the second control signal is inputted, a first electrode connected to the second power supply line, and a second electrode connected to the substrate.

3. A semiconductor integrated circuit as claimed in claim 2, wherein the first transistor has a lower threshold voltage than the second and the third transistors.

4. A semiconductor integrated circuit as claimed in claim 2, wherein the second control signal is an inverted signal of the first control signal.

5. A semiconductor integrated circuit comprising:
a first power supply line to which a first power supply potential is supplied;
a second power supply line to which a second power supply potential is supplied;
a first virtual power supply line;
a second virtual power supply line;
a logic circuit connected between the first and second virtual power supply lines;
a first power control transistor provided between the first power supply line and the first virtual power supply line, having a control electrode to which a first control signal is inputted;
a second power control transistor provided between the second power supply line and the second virtual power supply line, having a control electrode to which a second control signal is inputted;
a first substrate potential control circuit connected to a first conductive substrate on which the first power control transistor is formed, the first power supply line, and the second power supply line; and
a second substrate potential control circuit connected to a second conductive substrate on which the second power control transistor is formed, the first power supply line, and the second power supply line.

6. A semiconductor integrated circuit as claimed in claim 5, wherein the second control signal is an inverted signal of the first control signal.

7. A semiconductor integrated circuit as claimed in claim 6, wherein the first substrate potential control circuit comprises:
a first transistor having a control electrode and a first electrode commonly connected to the first power supply line, and a second electrode connected to the first conductive substrate;
a second transistor having a control electrode to which the second control signal is inputted, a first electrode connected to the first power supply line, and a second electrode connected to the first conductive substrate; and
a third transistor having a control electrode to which the second control signal is inputted, a first electrode connected to the second power supply line, and a second electrode connected to the first conductive substrate,
and the second substrate potential control circuit comprises:
a fourth transistor having a control electrode and a first electrode commonly connected to the second power supply line, and a second electrode connected to the second conductive substrate;
a fifth transistor having a control electrode to which the first control signal is inputted, a first electrode connected to the first power supply line, and a second electrode connected to the second conductive substrate; and
a sixth transistor having a control electrode to which the first control signal is inputted, a first electrode connected to the second power supply line, and a second electrode connected to the second conductive substrate.

8. A semiconductor integrated circuit as claimed in claim 7, wherein the first and fourth transistors have a lower threshold voltage than the second, third, fifth, and sixth transistors.

9. A semiconductor integrated circuit as claimed in claim 7, wherein the second control signal is an inverted signal of the first control signal.

10. A semiconductor integrated circuit comprising:
a first power supply line to which a first power supply potential is supplied;
a second power supply line to which a second power supply potential is supplied;
a first virtual power supply line;
a second virtual power supply line;
a logic circuit connected between the first and second virtual power supply lines;
a first power control transistor provided between the first power supply line and the first virtual power supply line, having a control electrode to which a first control signal is inputted;
a second power control transistor provided between the second power supply line and the second virtual power supply line, having a control electrode to which a second control signal is inputted;
a first transistor having a control electrode to which the second control signal is inputted, a first electrode connected to the first power supply line, and a second electrode connected to a first conductive substrate on which the first power control transistor is formed;
a second transistor having a control electrode to which the first control signal is inputted, a first electrode connected to the second power supply line, and a second electrode connected to the second conductive substrate on which the second power control transistor is formed; and
a third transistor having a control electrode to which the second control signal is inputted, a first electrode connected to the second electrode of the first transistor, and a second electrode connected to the second electrode of the second transistor.

11. A semiconductor integrated circuit as claimed in claim 10, wherein the first, the second, and the third transistors have one threshold voltage.

12. A semiconductor integrated circuit as claimed in claim 10, wherein the second control signal is an inverted signal of the first control signal.

13. A semiconductor integrated circuit comprising:
a first power supply line to which a first power supply potential is supplied;
a virtual power supply line;
a logic circuit connected to the virtual power supply line;
a power control transistor provided between the first power supply line and the virtual power supply line, having a control electrode to which a first control signal is inputted;
a second power supply line to which a second power supply potential is supplied;
a first transistor having a control electrode to which the first control signal is inputted, a first electrode connected to a substrate on which the power control transistor is formed, and a second electrode connected to the second power supply line;
a second transistor having a control electrode to which a second control signal is inputted, a first electrode connected to the first power supply line, and a second electrode connected to the substrate; and
a third transistor having a control electrode to which the second control signal is inputted, a first electrode connected to the substrate, and a second electrode connected to the second power supply line.

14. A semiconductor integrated circuit as claimed in claim 13, wherein the first, the second, and the third transistors have one threshold voltage.

15. A semiconductor integrated circuit as claimed in claim 13, wherein the second control signal is an inverted signal of the first control signal.

16. A semiconductor integrated circuit comprising:
a first power supply line to which a first power supply potential is supplied;
a second power supply line to which a second power supply potential is supplied;
a first virtual power supply line;
a second virtual power supply line;
a logic circuit connected between the first and second virtual power supply lines;
a first power control transistor provided between the first power supply line and the first virtual power supply line, having a control electrode to which a first control signal is inputted;
a second power control transistor provided between the second power supply line and the second virtual power supply line, having a control electrode to which a second control signal is inputted;
a third power supply line to which a third power supply potential is supplied;
a fourth power supply line to which a fourth power supply potential is supplied;
a first transistor having a control electrode to which the first control signal is inputted, a first electrode connected to a first conductive substrate on which the first power control transistor is formed, and a second electrode connected to the third power supply line;
a second transistor having a control electrode to which the second control signal is inputted, a first electrode connected to the first power supply line, and a second electrode connected to the first conductive substrate;
a third transistor having a control electrode to which the second control signal is inputted, a first electrode connected to the first conductive substrate, and a second electrode connected to the third power supply line;
a fourth transistor having a control electrode to which the second control signal is inputted, a first electrode connected to a second conductive substrate on which the second power control transistor is formed, and a second electrode connected to the fourth power supply line;
a fifth transistor having a control electrode to which the first control signal is inputted, a first electrode connected to the fourth power supply line, and a second electrode connected to the second conductive substrate; and
a sixth transistor having a control electrode to which the first control signal is inputted, a first electrode connected to the second conductive substrate,
and a second electrode connected to the second power supply line.

17. A semiconductor integrated circuit as claimed in claim 16, wherein the first through sixth transistors have one threshold voltage.

18. A semiconductor integrated circuit as claimed in claim 16, wherein the second control signal is an inverted signal of the first control signal.

19. A semiconductor integrated circuit comprising:
a first power supply line to which a first power supply potential is supplied;
a virtual power supply line;
a logic circuit connected to the virtual power supply line;
a power control transistor provided between the first power supply line and the virtual power supply line, having control electrode to which a first control signal is inputted;
a second power supply line to which a second power supply potential is supplied; and
a substrate potential control circuit connected to a substrate on which the power control transistor is formed, the first power supply line, and the second power supply line;
wherein the substrate potential control circuit comprises:
a first transistor having a control electrode and a first electrode commonly connected to the first power supply line, and a second electrode connected to the substrate;
a second transistor having a control electrode to which a second control signal is inputted, a first electrode connected to the first power supply line, and a second electrode connected to the substrate; and
a third transistor having a control electrode to which the second control signal is inputted, a first electrode connected to the second power supply line, and a second electrode connected to the substrate; and
wherein the first transistor has a lower threshold voltage than the second and the third transistors.

20. A semiconductor integrated circuit comprising:
a first power supply line to which a first power supply potential is supplied;
a virtual power supply line;
a logic circuit connected to the virtual power supply line;
a power control transistor provided between the first power supply line and the virtual power supply line, having control electrode to which a first control signal is inputted;
a second power supply line to which a second power supply potential is supplied; and
a substrate potential control circuit connected to a substrate on which the power control transistor is formed, the first power supply line, and the second power supply line;
wherein the substrate potential control circuit comprises:
a first transistor having a control electrode and a first electrode commonly connected to the first power supply line, and a second electrode connected to the substrate;
a second transistor having a control electrode to which a second control signal is inputted, a first electrode connected to the first power supply line, and a second electrode connected to the substrate; and
a third transistor having a control electrode to which the second control signal is inputted, a first electrode connected to the second power supply line, and a second electrode connected to the substrate; and
wherein the second control signal is an inverted signal of the first control signal.

* * * * *